(12) United States Patent
Sato

(10) Patent No.: US 9,691,831 B2
(45) Date of Patent: Jun. 27, 2017

(54) ORGANIC ELECTROLUMINESCENT DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 17 days.

(21) Appl. No.: 14/708,794

(22) Filed: May 11, 2015

(65) Prior Publication Data

US 2015/0333111 A1 Nov. 19, 2015

(30) Foreign Application Priority Data

May 13, 2014 (JP) .................................. 2014-099879

(51) Int. Cl.
*H01L 27/32* (2006.01)
*H01L 51/52* (2006.01)
*H05B 33/22* (2006.01)

(52) U.S. Cl.
CPC ...... *H01L 27/3258* (2013.01); *H01L 27/3246* (2013.01); *H01L 51/524* (2013.01); *H01L 2251/5338* (2013.01); *H05B 33/22* (2013.01)

(58) Field of Classification Search
CPC .............................................. H01L 2251/5338
See application file for complete search history.

(56) References Cited

U.S. PATENT DOCUMENTS

| 8,901,594 | B2* | 12/2014 | Nakatani | ............. | H01L 27/3223 257/40 |
| 2003/0103025 | A1* | 6/2003 | Kurokawa | ........... | G09G 3/3648 345/87 |
| 2003/0122140 | A1* | 7/2003 | Yamazaki | ......... | H01L 21/67207 257/88 |
| 2005/0003166 | A1* | 1/2005 | Hirai | ................. | G02F 1/136286 428/195.1 |
| 2007/0122923 | A1* | 5/2007 | Kho | ..................... | H01L 27/3246 438/21 |
| 2007/0194705 | A1* | 8/2007 | Sung | .................. | H01L 27/3276 313/506 |
| 2007/0196819 | A1* | 8/2007 | Asberg | ................. | B01L 3/5088 435/5 |
| 2009/0115321 | A1* | 5/2009 | Hayashi | ............. | H01L 51/5253 313/504 |

(Continued)

FOREIGN PATENT DOCUMENTS

JP 2012-216338 A 11/2012

*Primary Examiner* — Caridad Everhart
*Assistant Examiner* — Ankush Singal
(74) *Attorney, Agent, or Firm* — Typha IP LLC

(57) ABSTRACT

An organic electroluminescent display device of the invention includes a substrate on which a plurality of pixels are disposed in a matrix, an under layer that includes an organic insulating film and lower electrodes, a pixel separation film that is provided on the under layer so as to project therefrom, and an organic layer that covers the top of the under layer and the top of the pixel separation film and includes at least a light-emitting layer. A first adhesive film formed of one or more kinds of substances selected from the group consisting of amorphous carbon, diamond-like carbon, silicon, gallium, germanium, graphite oxide, and silicon carbide is formed at least partially between the top of the under layer and the pixel separation film or between the pixel separation film and the organic layer.

5 Claims, 7 Drawing Sheets

(56) References Cited

U.S. PATENT DOCUMENTS

| | | | |
|---|---|---|---|
| 2009/0309489 A1* | 12/2009 | Takata | H01L 27/3246 313/504 |
| 2010/0013372 A1* | 1/2010 | Oikawa | H01L 51/003 313/498 |
| 2010/0096633 A1* | 4/2010 | Hatano | H01L 27/1214 257/59 |
| 2010/0133993 A1* | 6/2010 | Pang | H01L 27/3246 313/504 |
| 2012/0248475 A1 | 10/2012 | Yamada et al. | |
| 2014/0183470 A1* | 7/2014 | Kim | H01L 27/3276 257/40 |
| 2014/0361261 A1* | 12/2014 | Choi | H01L 51/5218 257/40 |
| 2015/0115230 A1* | 4/2015 | Yoon | H01L 51/5259 257/40 |
| 2015/0137131 A1* | 5/2015 | Kim | H01L 51/5256 257/72 |

\* cited by examiner

ORGANIC ELECTROLUMINESCENT DISPLAY DEVICE

CROSS-REFERENCE TO RELATED APPLICATION

The present application claims priority from Japanese application JP 2014-099879 filed on May 13, 2014, the content of which is hereby incorporated by reference into this application.

BACKGROUND OF THE INVENTION

1. Field of the Invention

The present invention relates to an organic electroluminescent display device.

2. Description of the Related Art

An organic electroluminescent light-emitting element has attracted attention as a thin, light-weight light-emitting source, and an organic electroluminescent display device including a large number of organic electroluminescent light-emitting elements has been developed.

As such an organic electroluminescent display device, for example, JP 2012-216338 A discloses a configuration including: on a thin film transistor substrate on which thin film transistors are formed, a pixel separation film (second insulating film) that defines pixels; first electrodes (lower electrodes) each formed for each of the pixels; an organic film that covers the lower electrode and the top of the pixel separation film; a second electrode (upper electrode) that covers the top of the organic film; and a counter substrate disposed on the upper electrode.

SUMMARY OF THE INVENTION

In recent years, a flexible organic electroluminescent display device including a bendable substrate has been developed. However, when the bendable substrate is applied to the organic electroluminescent display device disclosed in JP 2012-216338 A, stress is likely to be applied to the periphery of the pixel separation film upon bending of the substrate.

For this reason, the organic film or lower electrode that is in contact with the pixel separation film may peel off from the pixel separation film due to the bending of the substrate. For this reason, the flexible organic electroluminescent display device has a problem that a failure may occur due to the peeling off of the organic film or the lower electrode.

The invention has been made in view of the circumstances described above, and it is an object of the invention to realize an organic electroluminescent display device capable of preventing the occurrence of a failure due to the peeling off of a pixel separation film from a layer adjacent to the pixel separation film.

A typical outline of the invention disclosed herein will be briefly described below.

(1) An organic electroluminescent display device according to an aspect of the invention includes: a substrate on which a plurality of pixels are disposed in a matrix; an under layer that includes an organic insulating film formed on the substrate, and lower electrodes each formed for each of the pixels on the organic insulating film; a pixel separation film that covers an outer edge of the lower electrode, is provided on the under layer so as to project therefrom, and defines the pixels; and an organic layer that covers the top of the under layer and the top of the pixel separation film, and includes at least a light-emitting layer, wherein a first adhesive film formed of one or more kinds of substances selected from the group consisting of amorphous carbon, diamond-like carbon, silicon, gallium, germanium, graphite oxide, and silicon carbide is formed at least partially between the top of the under layer and the pixel separation film or between the pixel separation film and the organic layer.

(2) In the organic electroluminescent display device according to the aspect of the invention, in (1), the first adhesive film may cover an upper surface of the lower electrode.

(3) In the organic electroluminescent display device according to the aspect of the invention, in (2), the first adhesive film may be formed between the upper surface of the lower electrode and a lower surface of the pixel separation film.

(4) In the organic electroluminescent display device according to the aspect of the invention, in any of (1) to (3), the organic electroluminescent display device may further include: an upper electrode that covers the organic layer; a second adhesive film that covers the upper electrode; and a sealing film that covers the second adhesive film.

(5) In the organic electroluminescent display device according to the aspect of the invention, in any one of (2) to (4), the first adhesive film may be formed between a lower surface of the pixel separation film and an upper surface of the organic insulating film.

(6) In the organic electroluminescent display device according to the aspect of the invention, in any of (2) to (5), a third adhesive film may be formed so as to cover at least a portion of the first adhesive film and an upper surface of the pixel separation film.

(7) In the organic electroluminescent display device according to the aspect of the invention, in (6), the first adhesive film and the third adhesive film may be formed while avoiding a light-emitting area of the lower electrode.

According to the invention, compared to an organic electroluminescent display device not having this configuration, since the adhesiveness between the pixel separation film in an area where the first adhesive film is disposed and a layer adjacent to the pixel separation film is improved, it is possible to prevent the occurrence of a failure due to the peeling off of the pixel separation film in the area where the adhesive film is disposed.

DETAILED DESCRIPTION OF THE INVENTION

Figure 1:
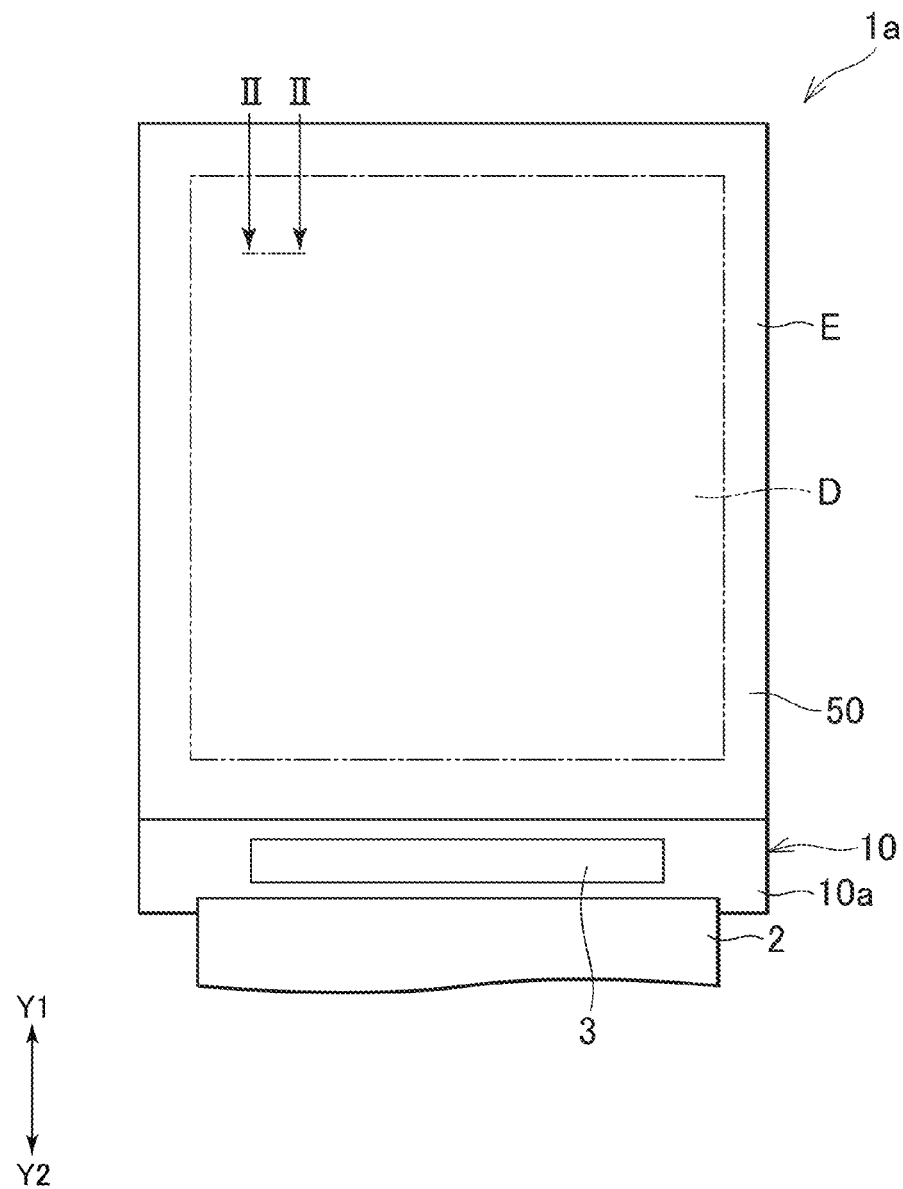
FIG. 1 is a schematic plan view of an organic electroluminescent display device according to a first embodiment of the invention.

Hereinafter, an organic electroluminescent display device according to an embodiment will be described using an organic electroluminescent display device 1a as an example based on the drawings. In the drawings referred to in the following description, a portion having a feature is shown in an enlarged manner in some cases for convenience sake to facilitate the understanding of the feature. Therefore, the dimension ratio or the like of each component is not always the same as that of an actual one. Moreover, materials or the like illustrated in the following description are illustrative only. Each component may be different from the illustrated one and can be implemented by modifications within the range not changing the gist thereof.

Figure 2:
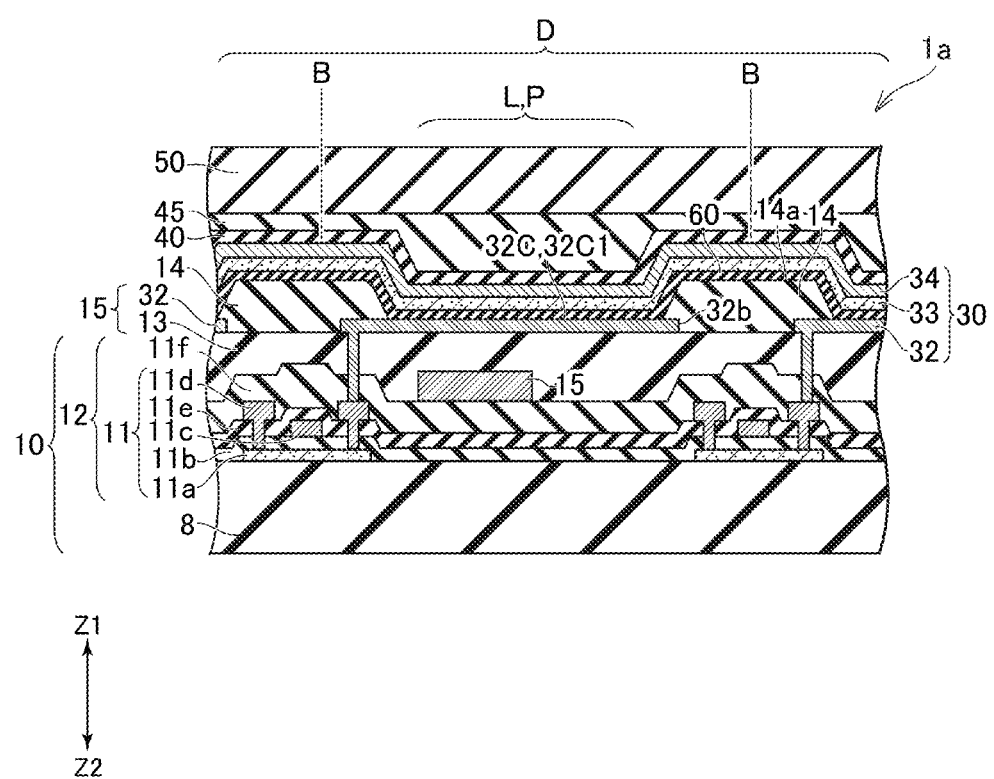
FIG. 2 is a schematic cross-sectional view of the organic electroluminescent display device shown in FIG. 1, taken along the line II-II.

FIG. 1 is a schematic plan view of the organic electroluminescent display device 1a according to a first embodiment of the invention. FIG. 2 is a schematic cross-sectional view of the organic electroluminescent display device 1a shown in FIG. 1, taken along the line II-II. For convenience of description in the embodiment, positional relationships among configurations will be described using coordinates of a Y-axis (Y1 direction, Y2 direction) and a Z-axis (Z1 direction, Z2 direction).

As shown in FIG. 1, the organic electroluminescent display device 1a includes a substrate (thin film transistor substrate) 10 having a rectangular display area D, and a counter substrate 50. The plan-view shape of the thin film transistor substrate 10 is larger than the plan-view shape of the counter substrate 50. An upper surface 10a of a portion of the thin film transistor substrate 10 (a portion on the Y2 direction side) is not covered with the counter substrate 50 and exposed. A flexible wiring board 2 and a driver IC (Integrated Circuit) 3 are connected on the upper surface 10a.

Next, the configuration of the display area D of the organic electroluminescent display device 1a will be described in detail. As shown in FIG. 2, a plurality of pixels P are disposed in a matrix on the thin film transistor substrate 10 in the display area D.

The thin film transistor substrate 10 includes an insulating substrate 8, a circuit layer 12 in which thin film transistors 11 and electrical wiring are formed, and a planarization film (organic insulating film) 13. Moreover, an under layer 15, organic electroluminescent light-emitting elements 30, a sealing film 40, color filters CF, a filler 45, and the counter substrate 50 are provided on the thin film transistor substrate 10.

The circuit layer 12 is a layer formed on the insulating substrate 8 for driving the organic electroluminescent light-emitting elements 30. In the circuit layer 12, the thin film transistor 11, a passivation film 11f, and electrical wiring (not shown) are formed.

The thin film transistor 11 is provided on the substrate 10 for each of the pixels P. Specifically, for example, the thin film transistor 11 includes a polysilicon semiconductor layer 11a, a gate insulating layer 11b, a gate electrode 11c, a source/drain electrode 11d, and a first insulating film 11e. The top of the thin film transistor 11 is covered with the passivation film 11f as an insulating film to protect the thin film transistor 11.

The under layer 15 includes the organic insulating film 13 and lower electrodes 32 described later. The organic insulating film 13 is a layer formed of an insulating organic material, and formed so as to cover the top of the circuit layer 12 (the thin film transistor 11). The organic insulating film 13 is formed of a material such as, for example, acrylic resin or polyimide.

A reflection film (not shown) formed of a metal film may be formed in an area corresponding to each of the pixels P on the organic insulating film 13. By providing the reflection film, light emitted from the organic electroluminescent light-emitting element 30 is reflected toward the counter substrate 50 side.

The plurality of organic electroluminescent light-emitting elements 30 are each formed for each of the pixels P on the organic insulating film 13. The organic electroluminescent light-emitting element 30 includes the lower electrode 32, an organic layer 33 including at least a light-emitting layer, and an upper electrode 34 formed so as to cover the top of the organic layer 33, so that an overlapping area of the lower electrode 32, the organic layer 33, and the upper electrode 34 functions as a light-emitting area L.

The lower electrode 32 is an electrode for injecting a drive current into the organic layer 33, and formed for each of the pixels P. Since the lower electrode 32 is connected to a contact hole, the lower electrode 32 is electrically connected to the thin film transistor 11 and supplied with a drive current.

The lower electrode 32 is formed of a conductive material. Specifically, for example, the material of the lower electrode is preferably ITO (Indium Tin Oxide), but may be a light-transmissive conductive material such as IZO (indium-zinc composite oxide), tin oxide, zinc oxide, indium oxide, or aluminum oxide composite oxide. If the reflection film is formed of a metal such as silver, and is to be in contact with the lower electrode 32, the lower electrode 32 may be light transmissive. In such a configuration, the reflection film is a portion of the lower electrode 32.

A pixel separation film 14 is formed between the lower electrodes 32 so as to separate the pixels P adjacent to each other. The pixel separation film 14 covers an outer edge 32b of the lower electrode 32, and exposes a portion of the lower electrode 32 corresponding to the light-emitting area L. The pixel separation film 14 projects from the under layer 15 toward the counter substrate 50 side (the Z1 direction side in the drawing), and is formed along a boundary B between the pixels P.

The pixel separation film 14 has functions of preventing contact between the lower electrodes 32 adjacent to each other and a leakage current between the lower electrode 32 and the upper electrode 34. The pixel separation film 14 is formed of an insulating material, and specifically, for example, the pixel separation film 14 is formed of a photosensitive resin composition. It does not matter whether the material of the pixel separation film 14 is an organic material or an inorganic material as long as the material is insulating.

In the organic electroluminescent display device 1a according to the invention, a first adhesive film 60 is formed at least partially between the top of the under layer 15 (the Z1 direction side in the drawing) and the pixel separation film 14 or between an upper surface 14a (surface on the Z1 direction side) of the pixel separation film 14 and the organic layer 33.

In the example shown in FIG. 2, the first adhesive film 60 is formed so as to be in contact with the upper surface 14a of the pixel separation film 14 and a surface 32c1, corresponding to the light-emitting area L, in an upper surface 32c of the lower electrode 32.

The first adhesive film 60 is formed of one or more kinds of substances selected from the group consisting of amorphous carbon, diamond-like carbon, silicon, gallium, germanium, graphite oxide, and silicon carbide.

Diamond-like carbon may be partially or uniformly doped with nitrogen. Moreover, silicon may be amorphous silicon, and silicon, gallium, or germanium may be an oxide thereof. The first adhesive film 60 may be a film formed of one kind of these materials or a combination of plural kinds of films. In the embodiment, an example in which the first adhesive film 60 formed of amorphous carbon is formed will be described.

The thickness of the first adhesive film 60 can be appropriately adjusted according to the configuration of the pixel separation film 14 or the material of the first adhesive film 60, but is preferably 5 nm or less. By setting the film thickness of the first adhesive film 60 to 5 nm or less, a reduction in the transmittance of the organic electroluminescent display device 1a is suppressed. In the embodiment, an example in which an amorphous carbon film having a film thickness of 1 to 5 nm is formed as the first adhesive film 60 will be descried.

The organic layer 33 is formed on the lower electrode 32 exposed (the area of the lower electrode 32 corresponding to the light-emitting area L) and on the pixel separation film 14 via the first adhesive film 60. For this reason, the organic layer 33 is in contact with an upper surface (surface on the Z1 direction side) of the first adhesive film 60.

The organic layer 33 is a layer including at least a light-emitting layer and formed of an organic material. The organic layer 33 includes, for example, a hole injection layer, a hole transport layer, a light-emitting layer, an electron transport layer, and an electron injection layer (all not shown) stacked in this order from the lower electrode 32 side. The stacked structure of the organic layer 33 is not limited to that mentioned herein, and the stacked structure is not specified as long as the stacked structure includes a light-emitting layer. The luminescent color of the light-emitting layer in the embodiment is white, but may be other colors.

The light-emitting layer includes, for example, an organic electroluminescent substance that emits light due to the recombination of holes and electrons. As such an organic electroluminescent substance, for example, a substance generally used as an organic light-emitting material is used.

The upper electrode 34 is formed so as to cover the top of the organic layer 33. The upper electrode 34 is not independent for each of the pixels P, and formed so as to cover the entire surface of the area where the pixels P are disposed in the display area D. With the configuration described above, the upper electrode 34 is in common contact with the organic layer 33 of the plurality of organic electroluminescent light-emitting elements 30.

The upper electrode 34 is formed of a light-transmissive conductive material. Specifically, for example, the material of the upper electrode 34 is preferably ITO, but may be one obtained by mixing a metal such as silver or magnesium into a conductive metal oxide such as ITO or InZnO, or one obtained by stacking a metal thin film such as silver or magnesium and a conductive metal oxide on top of each other.

An upper surface of the upper electrode 34 is covered with the sealing film 40 over the plurality of pixels P. The sealing film 40 is formed to prevent the entry of oxygen or moisture into the layers including the organic layer 33. The material of the sealing film 40 is not particularly limited as long as the material is an insulating transparent material.

The top of the sealing film 40 is covered with the counter substrate 50 via, for example, the filler 45. As the counter substrate 50, for example, a color filter substrate is used.

In the organic electroluminescent display device 1a according to the embodiment, the first adhesive film 60 is formed at least partially between the top of the under layer 15 and the pixel separation film 14 or between the pixel separation film 14 and the organic layer 33. Therefore, compared to an organic electroluminescent display device not having this configuration, the pixel separation film 14 and at least one of the under layer 15 and the organic layer 33 are firmly bonded together by means of the first adhesive film 60 in the area where the first adhesive film 60 is disposed.

Moreover, in the organic electroluminescent display device 1a according to the embodiment, since the first adhesive film 60 is disposed between the upper surface 14a of the pixel separation film 14 and the organic layer 33, the peeling off of the pixel separation film 14 from the organic layer 33 is suppressed.

For this reason, even when stress is applied to the pixel separation film 14 due to the bending of the thin film transistor substrate 10 or the like, the peeling off of the pixel separation film 14 is prevented in the area where the first adhesive film 60 is disposed. For this reason, it is possible to prevent the occurrence of a failure due to the peeling off of the pixel separation film 14.

Moreover, when the first adhesive film 60 is disposed between a film formed of an inorganic material and a film formed of an organic material, the adhesiveness between these films can be enhanced. For this reason, even when the pixel separation film 14 is formed of an inorganic material, the adhesiveness between the pixel separation film 14 and the organic layer 33 can be enhanced by disposing the first adhesive film 60 between the pixel separation film 14 and the organic layer 33, compared to an organic electroluminescent display device not having this configuration.

For this reason, in the example shown in FIG. 2, even when the pixel separation film 14 is formed of an inorganic material, it is possible to suppress a reduction in adhesiveness between the pixel separation film 14 and the organic layer 33, and the occurrence of a failure due to the peeling off of the pixel separation film 14 from the organic layer 33.

For this reason, by forming the pixel separation film 14 from an inorganic material, it is possible to realize the pixel separation film 14 that is minute and whose height above the thin film transistor substrate 10 (a height in the Z direction) is small, compared to a pixel separation film formed of an organic material. This makes it possible to realize the thinning and higher miniaturization of the organic electroluminescent display device 1a.

Moreover, as in the example shown in FIG. 2, since the first adhesive film 60 is disposed between the lower electrode 32 formed of an inorganic material and the organic layer 33 formed of an organic material, the peeling off of the lower electrode 32 from the organic layer 33 can be suppressed. For this reason, it is possible to suppress the occurrence of a failure in the organic electroluminescent display device 1a.

Moreover, since the first adhesive film 60 is insulating, the first adhesive film 60 does not affect electrical continuity between the pixels P adjacent to each other. Moreover, since the first adhesive film 60 in the embodiment has a function of suppressing the permeation of gas or moisture, it is possible to prevent the deterioration of the organic layer 33 due to the permeation of gas or moisture from the thin film transistor substrate 10 side.

In the invention, a place where the first adhesive film 60 is disposed is not limited to the place described above as long as the first adhesive film 60 is formed at least partially between the pixel separation film 14 and a layer adjacent to the pixel separation film 14. Examples in which the place where the first adhesive film 60 is disposed is changed will be described below.

Figure 3:
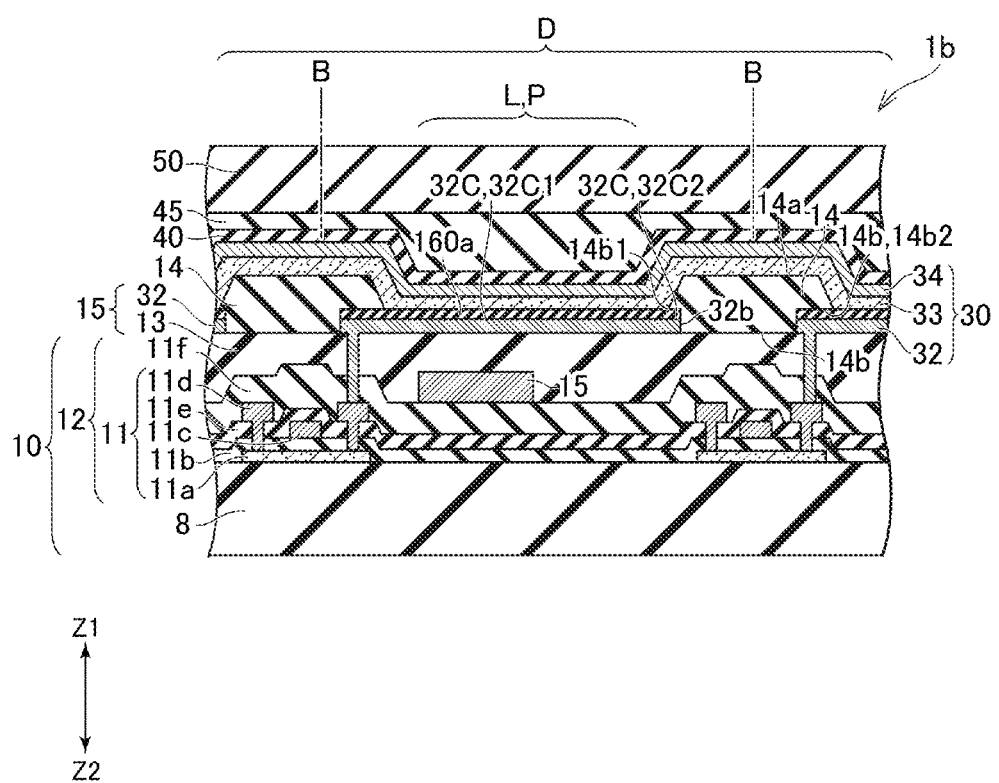
FIG. 3 is a schematic cross-sectional view showing an organic electroluminescent display device according to a second embodiment in the same field of view as FIG. 2.

FIG. 3 is a schematic cross-sectional view showing an organic electroluminescent display device 1b according to a second embodiment in the same field of view as FIG. 2. Hereinafter, the configuration of the organic electroluminescent display device 1b will be described, but a description of the same configuration as that of the organic electroluminescent display device 1a is omitted.

The organic electroluminescent display device 1b according to the second embodiment differs from the organic electroluminescent display device 1a according to the first embodiment in that a first adhesive film 160a is formed between an upper surface of the lower electrode 32 and a lower surface 14b of the pixel separation film 14 (between a surface 32c2 of the lower electrode 32 outside the surface 32c1 corresponding to the light-emitting area L and a lower surface 14b2 of the pixel separation film 14).

The first adhesive film 160a that covers the top of the lower electrode 32 as described above is formed by depositing or coating the material of the first adhesive film 160a on the thin film transistor substrate 10 on which the material of the lower electrode is deposited, and then patterning the material of the first adhesive film 160a together with the lower electrode 32.

In the organic electroluminescent display device 1b according to the embodiment, the first adhesive film 160a is formed to the outside (the surface 32c2) of the surface 32c1 of the lower electrode 32 corresponding to the light-emitting area L. Therefore, the first adhesive film 160a is disposed also between the surface 14b2 as a portion in contact with the lower electrode 32 in the lower surface 14b of the pixel separation film 14, and the surface 32c2 of the lower electrode 32.

For this reason, compared to an organic electroluminescent display device not having this configuration, the adhesiveness between the pixel separation film 14 and the lower electrode 32 is enhanced around an X-direction edge 14b1 of the lower surface 14b of the pixel separation film 14, especially to which stress is likely to be applied. This makes it possible to prevent the peeling off of the pixel separation film 14 from the lower electrode 32.

Moreover, since the upper surface of the lower electrode 32 is covered with the first adhesive film 160a, the contact of gas or moisture with the lower electrode 32 is prevented. For this reason, it is possible to realize the higher reliability and longer life of the organic electroluminescent display device 1b.

Moreover, since the first adhesive film 160a is disposed between the lower electrode 32 and the organic layer 33, the first adhesive film 160a functions as a film having hole injection characteristics. For this reason, it is possible to improve the hole injection characteristics of the organic electroluminescent light-emitting element 30.

Figure 4:
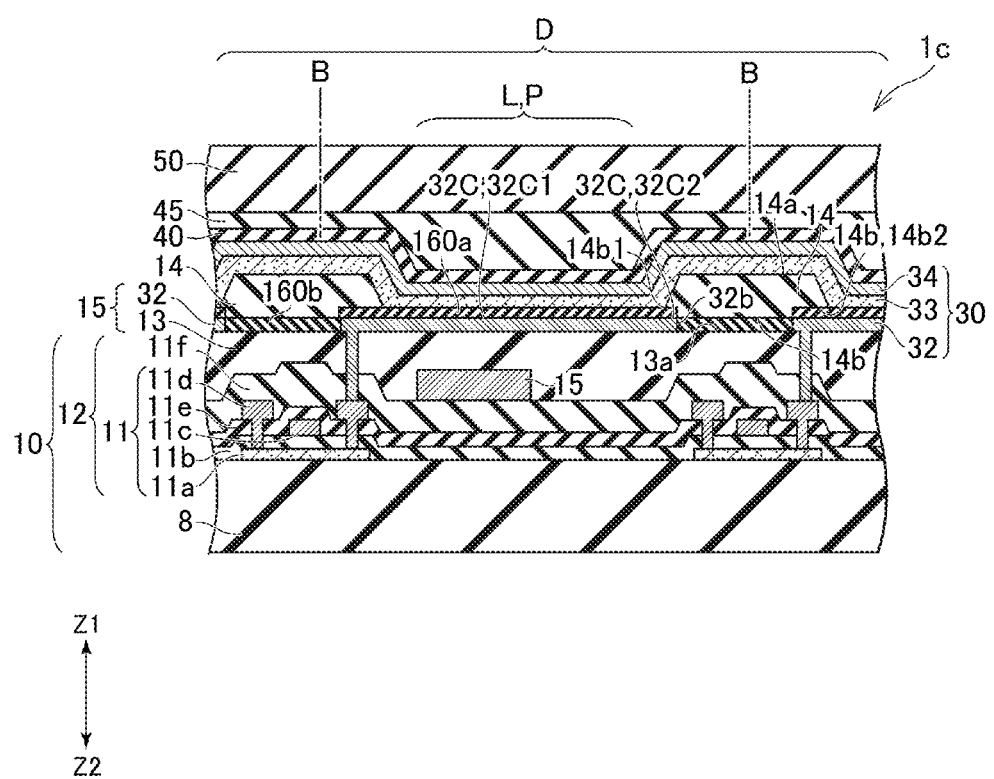
FIG. 4 is a schematic cross-sectional view showing an organic electroluminescent display device according to a third embodiment in the same field of view as FIG. 2.

Next, a third embodiment will be described. FIG. 4 is a schematic cross-sectional view showing an organic electroluminescent display device 1c according to the third embodiment in the same field of view as FIG. 2. The organic electroluminescent display device 1c according to the third embodiment differs from the organic electroluminescent display device 1b according to the second embodiment in that in addition to the first adhesive film 160a, a first adhesive film 160b is formed between the lower surface 14b of the pixel separation film 14 and an upper surface 13a of the organic insulating film 13.

In the organic electroluminescent display device 1c according to the embodiment, since the first adhesive film 160b is formed between the lower surface 14b of the pixel separation film 14 and the upper surface 13a of the organic insulating film 13, the adhesiveness between the pixel separation film 14 and the organic insulating film 13 can be enhanced, compared to an organic electroluminescent display device not having this configuration.

Especially even when the pixel separation film 14 is formed of an inorganic material, the adhesiveness between the pixel separation film 14 and the organic insulating film 13 can be maintained, and therefore, it is possible to realize the pixel separation film 14 that is minute and whose height (height in the Z direction) is small, in addition to the advantageous effects of the organic electroluminescent display device 1b according to the second embodiment. Due to the facts described above, it is possible to realize the thinning and higher miniaturization of the organic electroluminescent display device 1c.

Moreover, since gas generated from the organic insulating film 13 is prevented from escaping to the organic electroluminescent light-emitting element 30 side (the Z1 direction side) due to the formation of the first adhesive film 160b, the deterioration of the organic layer 33 (light-emitting layer) can be prevented.

Figure 5:
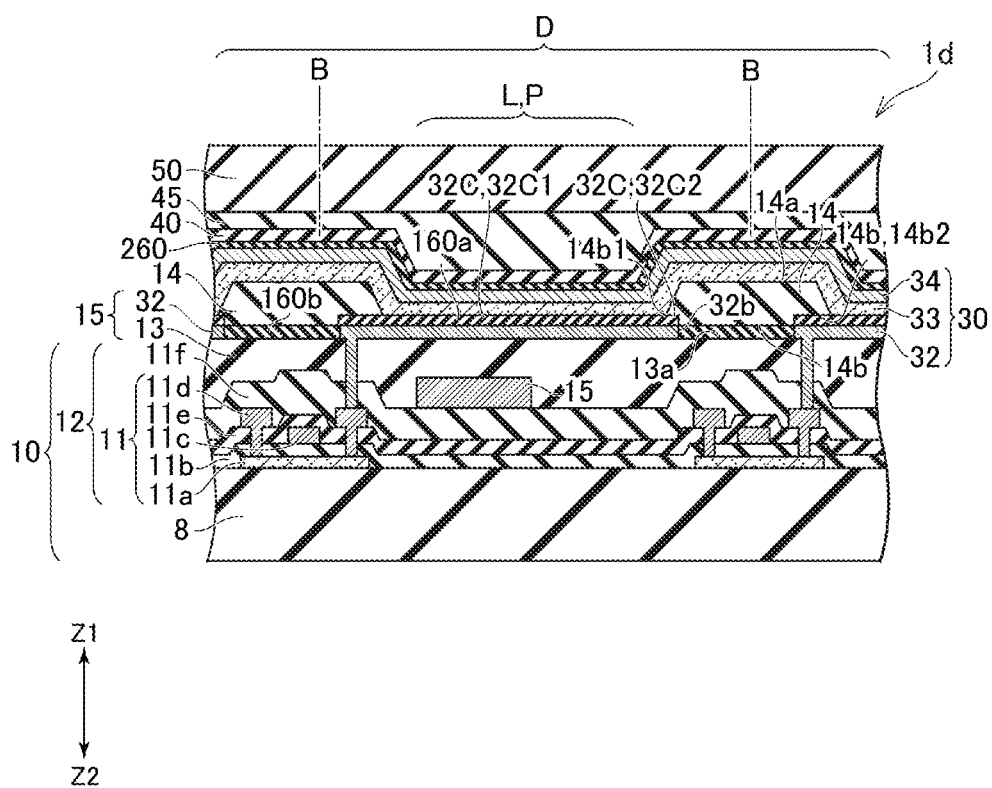
FIG. 5 is a schematic cross-sectional view showing an organic electroluminescent display device according to a fourth embodiment in the same field of view as FIG. 2.

Next, an organic electroluminescent display device 1d according to a fourth embodiment will be described. FIG. 5 is a schematic cross-sectional view showing the organic electroluminescent display device 1d according to the fourth embodiment in the same field of view as FIG. 2.

The organic electroluminescent display device 1d according to the fourth embodiment differs from the organic electroluminescent display device 1c according to the third embodiment in that a second adhesive film 260 is formed so as to cover the top of the upper electrode 34, and that the sealing film 40 is formed so as to cover the top of the second adhesive film 260.

The second adhesive film 260 is formed of one or more kinds of substances selected from the group consisting of amorphous carbon, diamond-like carbon, silicon, gallium, germanium, graphite oxide, and silicon carbide, similarly to the first adhesive films 60 and 160. In this case, it is possible, by selecting a high conductivity material or performing a process such as ion doping, to cause the second adhesive film 260 to function as an auxiliary electrode layer of the upper electrode, so that an organic electroluminescent display device with higher image quality can be realized.

Since the organic electroluminescent display device 1d according to the embodiment has the configuration described above, the adhesiveness between the upper electrode 34 and the sealing film 40 can be enhanced. For this reason, the sealing film 40 is prevented from peeling off from the upper electrode 34, so that the organic electroluminescent display device 1d with high reliability can be realized.

Moreover, since the second adhesive film 260 is formed so as to cover the top of the upper electrode 34, the second adhesive film 260 functions as a sealing film. For this reason, compared to an organic electroluminescent display device not having this configuration, the permeation of moisture or gas from the outside into the organic electroluminescent light-emitting element 30 is prevented, so that it is possible to realize the reliability improvement and longer life of the organic electroluminescent display device 1d.

Figure 6:
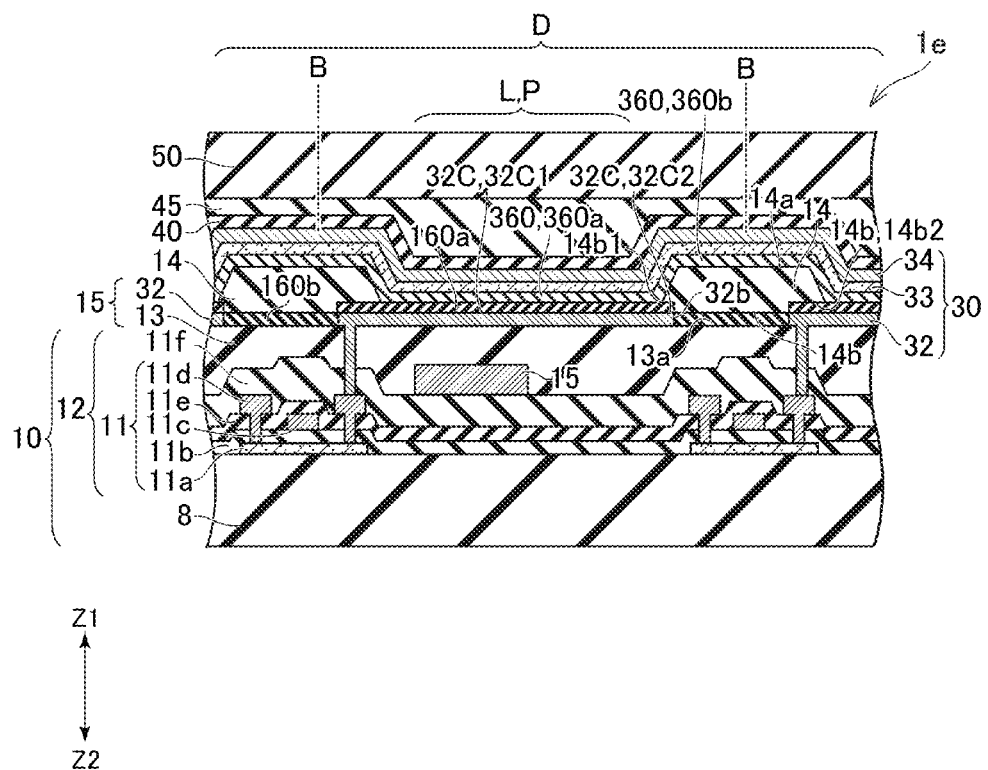
FIG. 6 is a schematic cross-sectional view showing an organic electroluminescent display device according to a fifth embodiment in the same field of view as FIG. 2.

Next, an organic electroluminescent display device 1e according to a fifth embodiment will be described. FIG. 6 is a schematic cross-sectional view showing the organic electroluminescent display device 1e according to the fifth embodiment in the same field of view as FIG. 2.

The organic electroluminescent display device 1e according to the fifth embodiment differs from the organic electroluminescent display device 1c according to the third embodiment in that a third adhesive film 360 is formed so as to cover at least a portion of the first adhesive film 160a and the upper surface 14a of the pixel separation film 14.

The third adhesive film 360 is formed of one or more kinds of substances selected from the group consisting of amorphous carbon, diamond-like carbon, silicon, gallium, germanium, graphite oxide, and silicon carbide, similarly to the first adhesive films 60 and 160.

In the embodiment, a portion of the third adhesive film 360 covering the top of the first adhesive film 160a is defined as a third adhesive film 360a, while a portion thereof covering the upper surface 14a of the pixel separation film 14 is defined as a third adhesive film 360b. The third adhesive film 360 in the embodiment covers an area of the first adhesive film 160a corresponding to the light-emitting area L.

The third adhesive film 360a covers the top of the first adhesive film 160a as described above, thereby being disposed between the lower electrode 32 and the organic layer 33 in a state where the third adhesive film 360a is integral with the first adhesive film 160a in the light-emitting area L.

The organic electroluminescent display device 1e described above is formed by depositing the adhesive film 160 on the lower electrode 32 and the upper surface 13a of the organic insulating film 13, and then successively depositing the pixel separation film 14 and the third adhesive film 360.

As described above, since the first adhesive film 160a covering the lower surface 14b of the pixel separation film 14 and the third adhesive film 360b covering the upper surface 14a of the pixel separation film 14 are formed, the organic electroluminescent display device 1e according to the embodiment has a configuration in which the edge 14b1 of the pixel separation film 14 is interposed between the first adhesive film 160a and the third adhesive film 360b in the vertical direction (the Z direction).

For this reason, compared to an organic electroluminescent display device not having this configuration, the adhesiveness between the pixel separation film 14 and the lower electrode 32 and the adhesiveness between the pixel separation film 14 and the organic layer 33 are enhanced around the edge 14b1 to which especially stress is likely to be applied. This makes it possible to prevent the peeling off of the pixel separation film 14 from the lower electrode 32 or the peeling off of the pixel separation film. 14 from the organic layer 33, in addition to the advantageous effects of the organic electroluminescent display device 1c.

Figure 7:
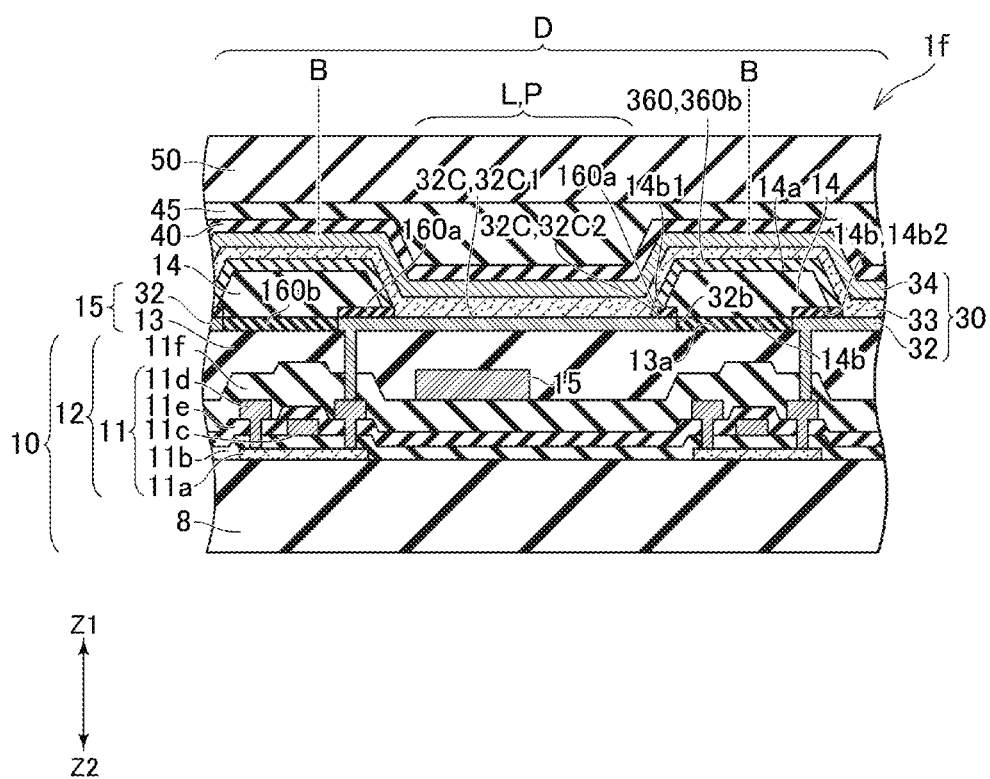
FIG. 7 is a schematic cross-sectional view showing an organic electroluminescent display device according to a sixth embodiment in the same field of view as FIG. 2.

Although the edge 14b1 of the pixel separation film 14 is preferably interposed between the first adhesive film 160a and the third adhesive film 360b in the vertical direction, the configuration for interposing the edge 14b1 is not limited to the example shown in FIG. 6. FIG. 7 is a schematic cross-sectional view showing an organic electroluminescent display device if according to a sixth embodiment in the same field of view as FIG. 2.

The organic electroluminescent display device if according to the sixth embodiment differs from the organic electroluminescent display device 1e according to the fifth embodiment in that the first adhesive film 160a and the third adhesive film 360a are formed while avoiding the light-emitting area L of the upper surface 32c1 of the lower electrode 32.

As shown in FIG. 7, a portion of the lower electrode 32 corresponding to the light-emitting area L may not be covered with the first adhesive film 160a and the third adhesive film 360a as long as the edge 14b1 is interposed between the first adhesive film 160a and the third adhesive film 360b.

The organic electroluminescent display device if described above is formed by depositing the third adhesive film 360 as in the organic electroluminescent display device 1e, and then etching the third adhesive film 360a and the first adhesive film 160a in the light-emitting area L.

Since the organic electroluminescent display device if according to the embodiment has the configuration described above, it is possible to prevent the peeling off of the pixel separation film 14 from the lower electrode 32 or the peeling off of the pixel separation film 14 from the organic layer 33 without reducing visibility in the light-emitting area L.

Although the embodiments of the invention have been described so far, the invention is not limited to the embodiments described above. For example, the configuration described in each of the embodiments described above may be replaced with substantially the same configuration, a configuration providing the same operational effect, or a configuration capable of achieving the same object.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic electroluminescent display device comprising:
   a substrate on which a plurality of pixels are disposed in a matrix;
   an under layer comprising an organic insulating film formed on the substrate, and lower electrodes each formed for each of the pixels on the organic insulating film;
   a pixel separation film that covers an outer edge of the lower electrode, is provided on the under layer so as to project therefrom, and defines the pixels; and
   an organic layer that covers the top of the under layer and the top of the pixel separation film, and includes at least a light-emitting layer, wherein
   a first adhesive film formed of one or more kinds of substances selected from the group consisting of amorphous carbon, diamond-like carbon, silicon, gallium, germanium, graphite oxide, and silicon carbide is formed at least partially between the top of the under layer and the pixel separation film or between the pixel separation film and the organic layer,
   wherein
   the first adhesive film covers an upper surface of the lower electrode, and
   the first adhesive film is formed between a lower surface of the pixel separation film and an upper surface of the organic insulating film.

2. The organic electroluminescent display device according to claim 1, wherein
the first adhesive film is formed between the upper surface of the lower electrode and a lower surface of the pixel separation film.

3. The organic electroluminescent display device according to claim 1, further comprising:
an upper electrode that covers the organic layer;
a second adhesive film that covers the upper electrode; and
a sealing film that covers the second adhesive film.

4. The organic electroluminescent display device according to claim 1, wherein
a third adhesive film is formed so as to cover at least a portion of the first adhesive film and an upper surface of the pixel separation film.

5. The organic electroluminescent display device according to claim 4, wherein
the first adhesive film and the third adhesive film are formed while avoiding a light-emitting area of the lower electrode.

* * * * *